(12) United States Patent
Vinson et al.

(10) Patent No.: US 11,716,819 B2
(45) Date of Patent: Aug. 1, 2023

(54) ASYMMETRICAL ELECTROLYTIC PLATING FOR A CONDUCTIVE PATTERN

(71) Applicant: AVERATEK CORPORATION, Santa Clara, CA (US)

(72) Inventors: Michael Riley Vinson, Sunnyvale, CA (US); Shinichi Iketani, Sunnyvale, CA (US)

(73) Assignee: Averatek Corporation, Santa Clara, CA (US)

( * ) Notice: Subject to any disclaimer, the term of this patent is extended or adjusted under 35 U.S.C. 154(b) by 806 days.

(21) Appl. No.: 16/449,202

(22) Filed: Jun. 21, 2019

(65) Prior Publication Data
US 2019/0394887 A1    Dec. 26, 2019

Related U.S. Application Data

(60) Provisional application No. 62/688,123, filed on Jun. 21, 2018.

(51) Int. Cl.
*H05K 3/42* (2006.01)
*H05K 3/00* (2006.01)
*C25D 7/00* (2006.01)

(52) U.S. Cl.
CPC ............ *H05K 3/424* (2013.01); *C25D 7/00* (2013.01); *H05K 3/0023* (2013.01); *H05K 3/0044* (2013.01); *H05K 3/425* (2013.01); *H05K 2203/0723* (2013.01)

(58) Field of Classification Search
CPC .... C25D 7/424; H05K 3/0023; H05K 3/0044; H05K 3/424; H05K 3/425; H05K 2203/0723
See application file for complete search history.

(56) References Cited

U.S. PATENT DOCUMENTS

| | | | |
|---|---|---|---|
| 4,017,968 A | | 4/1977 | Weglin |
| 4,211,603 A | * | 7/1980 | Reed ...................... H05K 3/429 |
| | | | 174/266 |
| 4,842,699 A | | 6/1989 | Hua |
| | | | (Continued) |

FOREIGN PATENT DOCUMENTS

| | | | |
|---|---|---|---|
| TW | 201036509 | | 10/2010 |
| WO | 2017/036816 | * | 3/2017 |

OTHER PUBLICATIONS

"Pulse Reverse Copper Plating for Printed Circut Boards" W.F. Hall et al Proc. American Electrochemical Soc. 10th Plating in the lectronic Industry Symposium Feb. 1983.*

*Primary Examiner* — Donghai D Nguyen
(74) *Attorney, Agent, or Firm* — Fish IP Law, LLP

(57) ABSTRACT

The present invention relates to methods and systems for deposition of metal conductors using asymmetrical electrolytic plating, in which one surface (e.g., top) of a substrate is coated with an electrical conductor, and an opposite (e.g., bottom, or other) surface of which is not coated. A channel is formed between the two sides of the substrate, passing through the substrate and, in some embodiments, passing through the conductor. Electrolytic plating is performed such that metal is deposited from the edge of the conduct proximal to the channel, along the side walls of the channel, and up to, and in some embodiments on to, the other side of the substrate. Use of etching or plate resist layers are also contemplated.

13 Claims, 4 Drawing Sheets

(56) References Cited

U.S. PATENT DOCUMENTS

| | | | |
|---|---|---|---|
| 4,891,069 A | | 1/1990 | Holtzman |
| 6,099,711 A * | | 8/2000 | Dahms ................. C25D 5/627 205/292 |
| 6,783,654 B2 * | | 8/2004 | Inoue .................... H05K 3/423 205/291 |
| 7,589,009 B1 * | | 9/2009 | Kar-Roy ........... H01L 21/76898 257/E21.011 |
| 8,101,496 B2 * | | 1/2012 | Takao ................. H01L 23/3114 438/406 |
| 8,212,331 B1 * | | 7/2012 | Kar-Roy ........... H01L 21/76898 257/508 |
| 8,784,634 B2 * | | 7/2014 | Reents ..................... C25D 5/18 205/291 |
| 8,841,751 B2 * | | 9/2014 | Wang .................. H01L 21/486 257/618 |
| 8,963,316 B2 * | | 2/2015 | Hsu ....................... H01L 24/06 257/692 |
| 8,987,734 B2 * | | 3/2015 | Wang .................... H01L 22/34 257/48 |
| 9,024,445 B2 * | | 5/2015 | Chen ..................... H01L 24/06 257/774 |
| 9,113,547 B2 | | 8/2015 | Guzek |
| 9,445,510 B2 * | | 9/2016 | Reents .................. H05K 3/423 |

\* cited by examiner

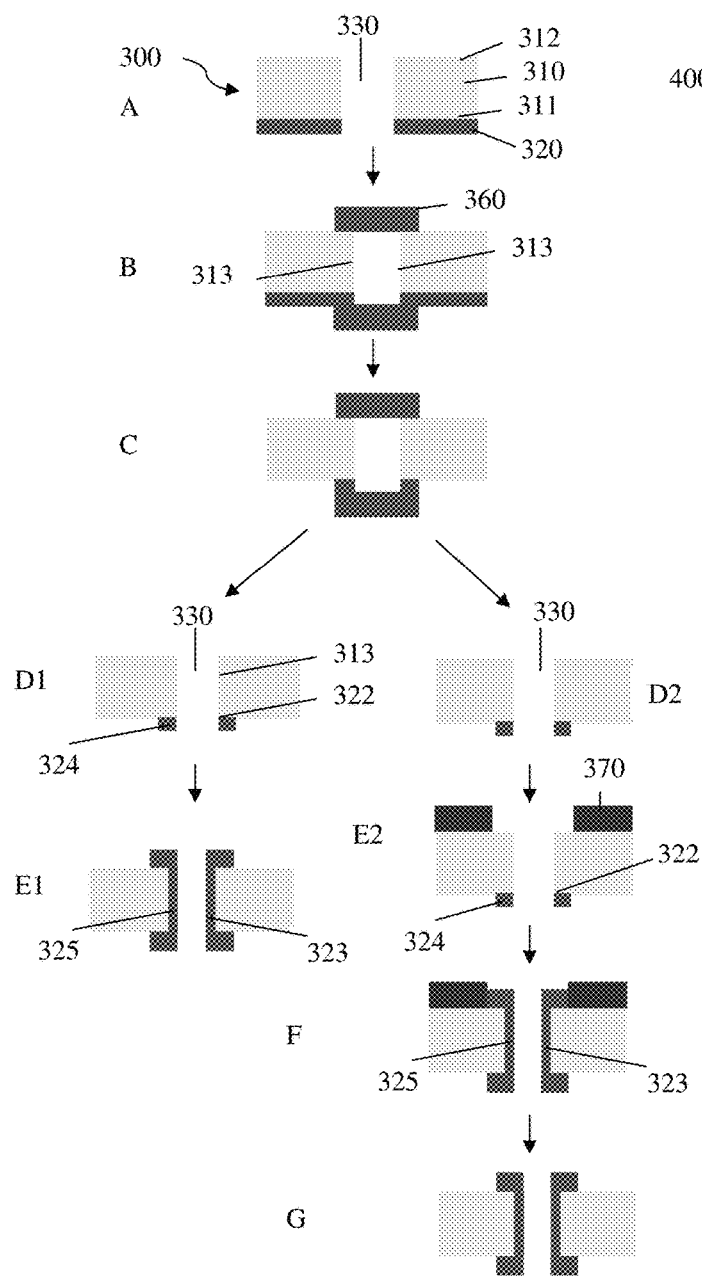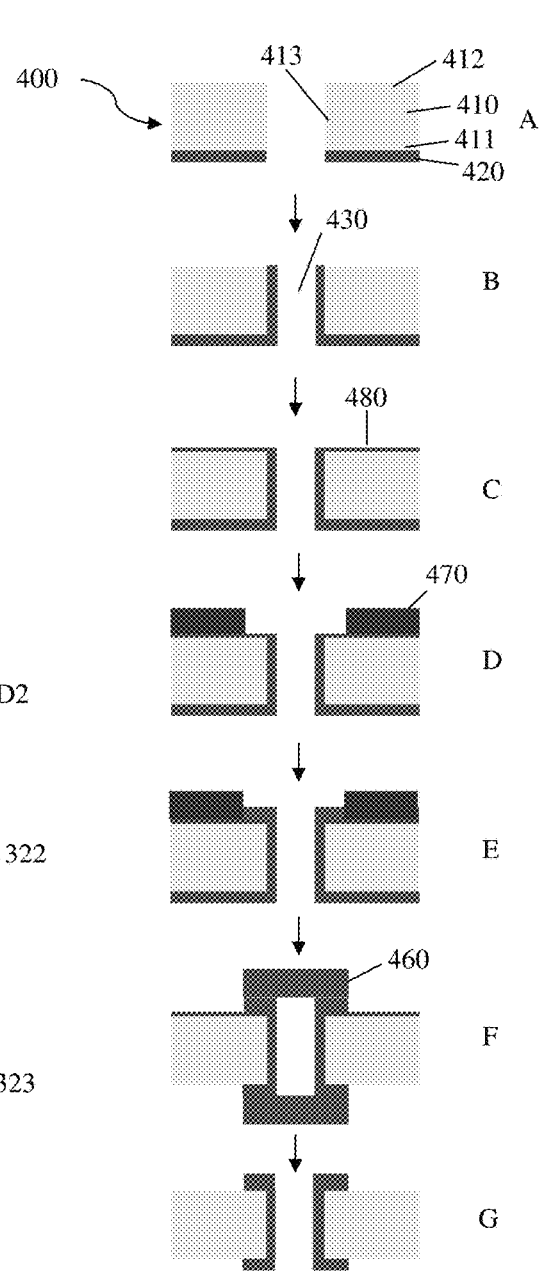
Figure 3
Figure 4

ASYMMETRICAL ELECTROLYTIC PLATING FOR A CONDUCTIVE PATTERN

This application claims the benefit of priority to U.S. provisional application 62/688,123 filed on Jun. 21, 2018. This and all other extrinsic references referenced herein are incorporated by reference in their entirety.

FIELD OF THE INVENTION

The present invention relates to methods for metal patterning on a substrate.

BACKGROUND

The following background description includes information that may be useful in understanding the present invention. It is not an admission that any of the information provided herein is prior art or relevant to the presently claimed invention, or that any publication specifically or implicitly referenced is prior art.

There is a need in microelectric circuit production to make electrically conductive vias between different circuit layers. There are basically two ways to accomplish this goal, electroless plating and electrolytic plating. In electroless plating, deposition occurs from an autocatalytic reaction of the plating chemistry with a base material. Electroless plating is problematic because the process is time consuming, and requires deposition of a catalytic layer prior to depositing a metal. Electrolytic plating omits the requirement for a catalytic layer, but does require some sort of conductive surface upon which a metal can be deposited.

Electrically conducting vias can be produced using electroless metal deposition. For example, TW201036509 to Tarng teaches manufacturing of embedded holes and trenches in a substrate, which are then filled with metal by electroless metal deposition. This publication and others referenced herein are hereby incorporated by reference in their entireties. The process is problematic, however, because the plating step takes an excessively long time to deposit the metal deposition, and it requires catalytic reaction prior to the plating.

For example, U.S. Pat. No. 9,113,547 to Guzek teaches metal deposition into a blind via hole using electroless plating followed by electrolytic plating. In this process, the via hole is filled with metal deposition, and the process is not suitable for making the layer of metal along the sides of the via holes.

Various methods are also known for producing electrically conductive via holes using electrolytic plating. For example, U.S. Pat. No. 4,842,699 teaches metal deposition creating the metal layer inside of the via holes. However, the walls and the bottom of the via holes is coated with thin conductive film prior to electrolytic plating, therefore one extra step is required to make the thin metal layer along the walls of the via hole. Consequently, the prior art methods, however, are problematic because the fail to produce vias with thin metal walls along the sides of the vias.

Thus, there is still a need for novel method to produce electrically conducting vias having thin metal walls along the sides of the via channels.

SUMMARY OF THE INVENTION

The inventive subject matter provides methods for metal deposition using asymmetrical electrolytic plating, in which one surface of the substrate is coated with an electrical conductor, and an opposite (or other) surface of which is not coated.

In a preferred embodiment, a substrate comprises a dielectric material ceramic, polymer and insulated metal, having a board or plate structure. One surface (on a first side of the substrate) is coated with an electrical conductor, and an opposite surface (on a second side of the substrate) is not coated. Preferred electrical conductors have high electrical conductivity, including for example, one or more of gold, silver, nickel, copper, aluminum, lithium, iron, palladium, platinum, iridium, and alloys of the aforementioned metals.

Channels (e.g., holes, through holes, etc) are created within the substrate, and they can be created prior to or following plating of the electrical conductor onto the substrate. The channels can be created in any suitable manner, including by laser or mechanical drilling, or by use of a photolithography technique. Contemplated channels can extend entirely through the substrate and the electrical conductor layer, or only through the substrate.

The substrate, along with the electrical conductor layer and one or more channels, is placed in an electrically conducting bath in the presence of voltage differential between an anode and the electrical conductor (acting as a cathode). This causes metal from an anode to be deposited onto the electrical conductor by electrolytic plating. Here again, the metal can advantageously comprise any one or more of gold, silver, nickel, copper, aluminum, lithium, iron, palladium, platinum, iridium, and alloys of the aforementioned metals.

Metal from the anode will not be significantly deposited directly onto the substrate. But since metal from the anode will be deposited in any accessible area of the electrical conductor, metal will begin to be deposited at the bottom of the channel, where the electrical conductor meets the first side of the substrate. Metal deposited at the bottom of the channel will then trigger additional deposition, and a thin wall of metal with then grow up along the sides of the channel. Eventually, this growth will reach the other end of the channel, and begin to grow out along the second side of the substrate.

In some embodiments, when sufficient metal is plated onto the second side of the substrate, a plating resist is applied over at least a portion of the deposited metal on that second side, thereby preventing further deposition into or around the open end of the channel. Preferred materials to be used for the plating resist include photoimagable and non-photoimagable polymer film, wax, oligomer, and hardmask. Some of the plating resist only affects the electroless plating and includes polymers and modified polymer.

The etching resist can additionally be applied about the end of the channel on the first side of the substrate. After etching resist is applied, the remaining electrical conductor and electro-deposited metal is removed by etching, leaving intact an electrically conducting via with metal deposited in a thin, even, vertical layer on the sides of the channel (s). Preferred etching resist materials include photoimagable and non-photoimagable polymer film, wax, metal, oligomer, and hardmask.

Further contemplated are methods of forming an electrically conductive path on a substrate, and systems and devices produced by such methods. The substrate has two sides that are not coplanar, for example intersecting at an angle (e.g., L shaped corner) or not interesting at all (e.g., parallel sides, top and bottom, etc). A first conductive material is deposited on one side of the substrate, and a channel is formed between the two sides of the substrate.

The channel is preferably formed after the first conductive material is deposited, and in some embodiments extends through at least a portion of the first conductive material. Using electrolytic plating, a second conductive material is deposited such that the second conductive material proceeds from the first conductive material (or portion thereof), across a wall of the channel, and extends to at least a surface of the channel adjacent to the other side of the substrate, preferably extending to cover at least a portion of the second side of the substrate.

In some embodiments, a portion of the first conductive material proximal to the channel (e.g., about the mouth of the channel) is protected with an etching resist material (e.g., etching resist material is deposited over the first conductive material in that region). The first conductive material not protected by the etching resist material is preferably removed, either chemically, mechanically, thermally, or by other appropriate means. It is further contemplated that a portion of the second conductive material proximal to the channel (e.g., about the mouth) is protected with an etching resist material, and that the second conductive material not protected by the etching resist material is removed. In some embodiments, both the first and second material are treated in such a fashion.

The description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

BRIEF DESCRIPTION OF THE DRAWINGS

FIG. 3 illustrates a cross-sectional view of metal deposition along the sides of a channel using asymmetrical electrolytic plating, where an etching resist is deposited prior to the electrolytic plating.

FIG. 4 illustrates a cross-sectional view of metal deposition along the sides of a channel using asymmetrical electrolytic plating, followed by electroless plating that uses both etching and plating resists.

DETAILED DESCRIPTION

The inventive subject matter provides methods describing metal deposition along the sides of a channel formed within a dielectric substrate, using asymmetrical electrolytic plating. The metal deposition is formed on a dielectric substrate by electrolytic plating, starting from an end of the channel where the substrate is coated with an electrical conductor.

Figure 1:
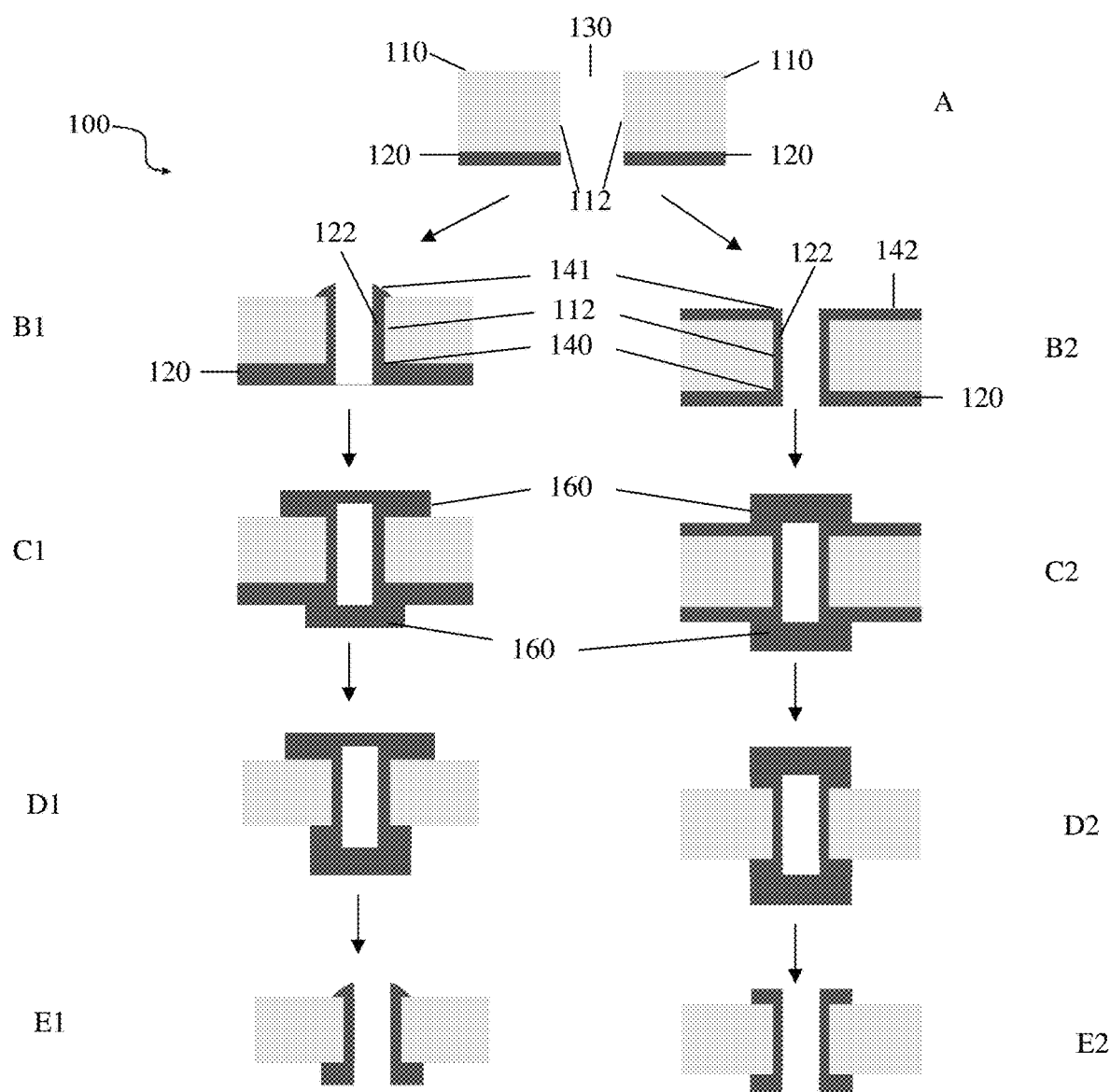
FIG. 1 illustrates a cross-sectional view of steps in depositing metal along the sides of a channel using asymmetrical electrolytic plating, using an etching resist.

FIG. 1 shows steps of a process 100 in which metal is deposited along the sides of the channel 130 using asymmetrical electrolytic plating. A substrate 110 is comprised of dielectric material and has a board structure. One surface (e.g., bottom surface) of the substrate 110 is coated by a layer of an electrical conductor 120 while the opposite surface (e.g., top surface) is not coated. The plating of an electrical conductor on substrate 110 is carried out by, for example, catalytic plating on a surface of the substrate 110, followed by electroless plating on the surface. A channel (hole) 130 is created in substrate 110, which includes channel 130 extending through electric conductor 120 as well as substrate 110. While FIG. 1 depicts forming a substrate with electrical conductor on one side and a channel passing through both the substrate and the electrical conductor, in some embodiments such are prefabricated, with the combination depicted in step A ready for additional processing Electrolytic plating is applied to substrate 110 (e.g., substrate placed in electrolytic bath), which causes metal deposition to grow from ends 140 of electrical conductor 120. As conductor continues to plate to ends 140 of electrical conductor 120, the conductor plates up interior walls 112 of substrate 110 (walls of channel 130) forming wall conductor 122, until it reaches the mouth of channel 130 forming conductor edge 141 (see steps B1 and B2). In some embodiments, electrolytic plating is continued further, which allows conductor to continue plating from conductor edge 141 and over the top surface of substrate 110, forming top conductor 142 (see step B2). In the two steps of B1 and B2, wall conductor 122 is deposited in a thin, even, and essentially vertical layer along the sides of the channel.

Whether plating is stopped after conductor edge 141 is formed as in step B1, or allowed to continue and form top conductor 142 as in B2, the following steps C1 and C2 deposits an etching resist 160 over both mouths of channel 130, and covering portions of conductor 120, conductor edge 141, and top conductor 142 (step C2) proximal to channel 130. Steps D1 and D2 then apply either mechanical or chemical etching process to remove portions of conductor 120 and top conductor 142. In steps E1 and E2, etching resist 160 is removed (e.g., mechanically, chemically, thermally, light, etc), yielding substrate 110 with electroless plated conductor on the bottom surface, and thin electrolytic plated conductors vertically along the wall of channel 130, with conductor edge 141 (steps E1 and E2) or portions of top conductor 142 (step E2) on the top surface of substrate 110.

Figure 2:
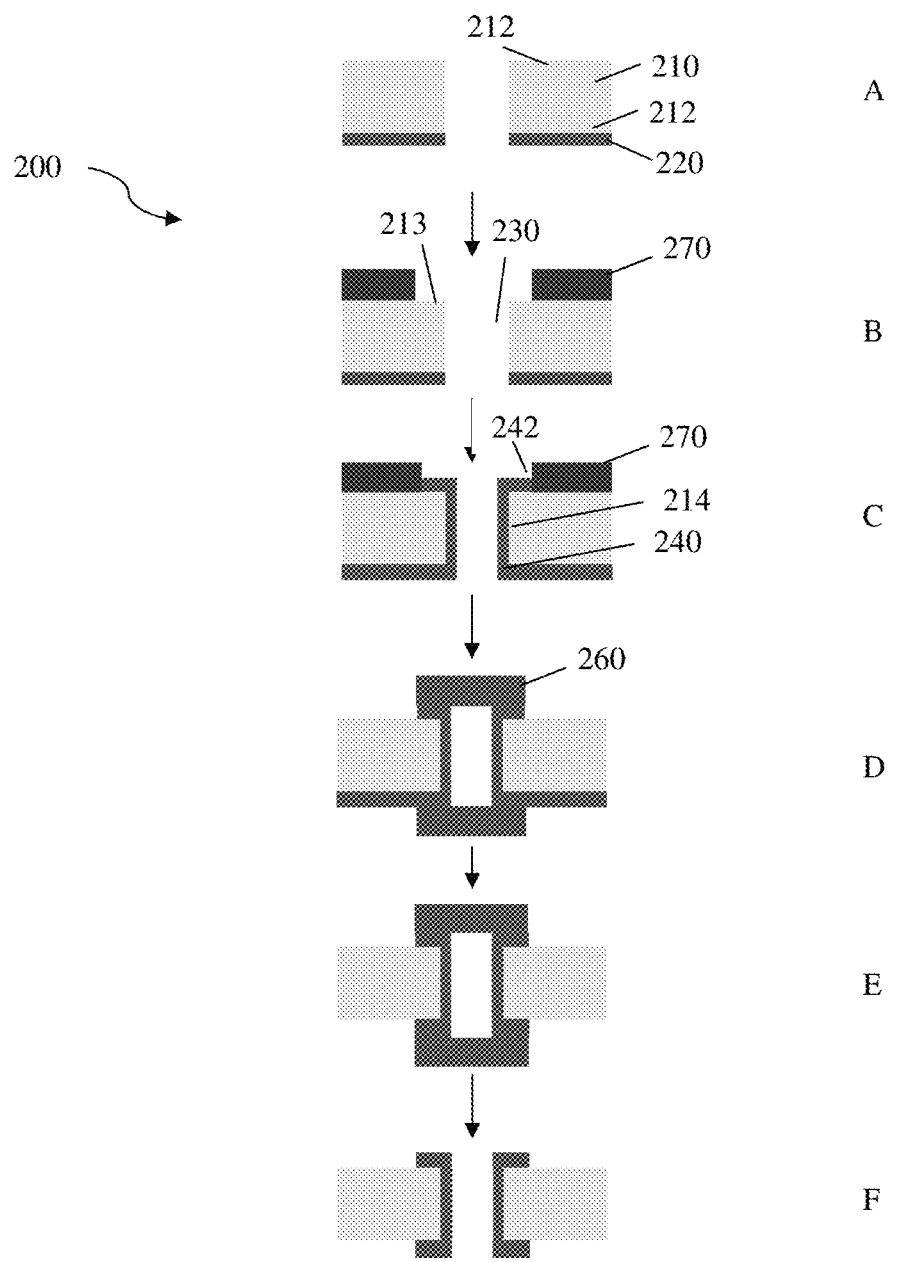
FIG. 2 illustrates a cross-sectional view of metal deposition along the sides of a channel using asymmetrical electrolytic plating, using a plating resist.

FIG. 2 shows steps of another process 200 in which metal is deposited along the sides of a channel 230 using asymmetrical electrolytic plating. In step A, surface 212 (e.g., bottom surface) of substrate 210 is coated by a layer of electrical conductor 220, and the opposite surface 212 is not coated (e.g., top surface). Channel 230 is then formed through substrate 210 and conductor 220. In step B, a plating resist 270 is applied on opposite surface 212, except for rim surface 213 of opposite surface 212 proximal to channel 230. In step C, electrolytic plating is applied on substrate 210, which causes the metal deposition to start from the end 240 of the electrical conductor, and grow continuously up channel wall 214, and onto rim surface 213 of substrate 210, to the end 242 against, or immediately adjacent to, plating resist 270. In some embodiments, an etching resist 260 is applied about both ends of the channel to protect from etching in step D, either before or after removing plating resist 270 from substrate 210. Etching is performed in step E, which removes any conductor not protected or covered by etching resist 260. Etching resist 260 is removed in step F, leaving behind the conductor plated to the substrate. Viewed from another perspective, the process of FIG. 2 of FIG. 2 produces a substrate with a channel having thin electrolytic plated conductor extending from a conductor on the bottom surface of the substrate, vertically up the walls of a channel, and forming a thin conductor on the top surface of the substrate.

FIG. 3 shows steps of another process 300 in which metal is deposited along the sides of a channel 330 using asymmetrical electrolytic plating. In step A, one surface (311) of substrate 310 is coated by a layer of an electrical conductor 320 and the other, opposing surface (312) is not coated. Channel 330 is then formed through substrate 310 and electrical conductor 320, for example by mechanical or laser methods. Etching resist 360 is then applied in step B on surfaces 311 and 312 about both ends of channel 330 and covering channel 330. Etching is performed in step C, removing portions of electrical conductor 320 from substrate surface 311 that were not protected by etching resist 360. After etching is performed, the etching resist is removed in steps D1 and D2, exposing wall surface 313 inside channel 330, substrate surfaces 311 and 312, and conductor portions 322 and 324 on surface 311.

In some embodiments, electrolytic plating is then performed on the substrate 310, such that conductor deposition starts from conductor portions 322 and 324, extends along wall surface 313 of channel 330 in a thin line, and ultimately extending onto surface 312 the substrate (see step E1). As depicted, the electrolytic plating is terminated once the conductor deposition reaches a desired position on substrate surface 312, providing conductors 323 and 325 extending from substrate surfaces 311 and 312 across wall surface 313.

In some embodiments, plating resist 370 is applied onto substrate surface 312, except for portions of surface 312 proximal to the opening of channel 330 (see step E2). The electrolytic plating is then performed, such that conductor deposition starts from conductor portions 322 and 324, extends along wall surface 313 of channel 330 in a thin line, and ultimately extending onto surface 312 the substrate (see step F). Conductor deposition ceases when the conductor meets or is immediately adjacent to plating resist 370. Plating resist is then removed in step G, leaving conductors 323 and 325 extending from substrate surfaces 311 and 312 across wall surface 313.

FIG. 4 shows steps of another process 400 in which metal is deposited along the walls 413 of channel 430 using asymmetrical electrolytic plating. In step A, substrate 410 is plated with conductor 420 (e.g., via electroless or catalytic deposition) on side 411 (e.g., bottom side), and channel 430 is formed through substrate 410, having wall surface 413. In step B, electrolytic plating is performed, such that metal deposition starts from the end of conductor 420 proximal to channel 430, and extends along wall surface 413 toward substrate surface 412. Electrolytic deposition is ceased when the plated conductor is approximately flush with substrate surface 412. In step C, electroless plating is performed, such that additional conductor 480 is deposited on substrate surface 412. In step D, plating resist 470 is applied to the surface of conductor 480, leaving open a portion of conductor 480 proximal to channel 430. In step E, additional electrolytic plating is performed, increasing the deposit (e.g., depth, volume, etc) of conductor 480. In step F, plating resist 470 is removed, and etching resist 460 is applied on conductors 420 and 480 on surfaces 411 and 412 about both ends of channel 430 and covering channel 430. The portions of conductor 480 not covered by etching resist 460 are then etched away. Etching resist 460 is then removed in step F, leaving a substrate with thin line of conductor plated from one side of the substrate, along the walls of a channel in the substrate, and to the opposite side of the substrate.

Figure 5:
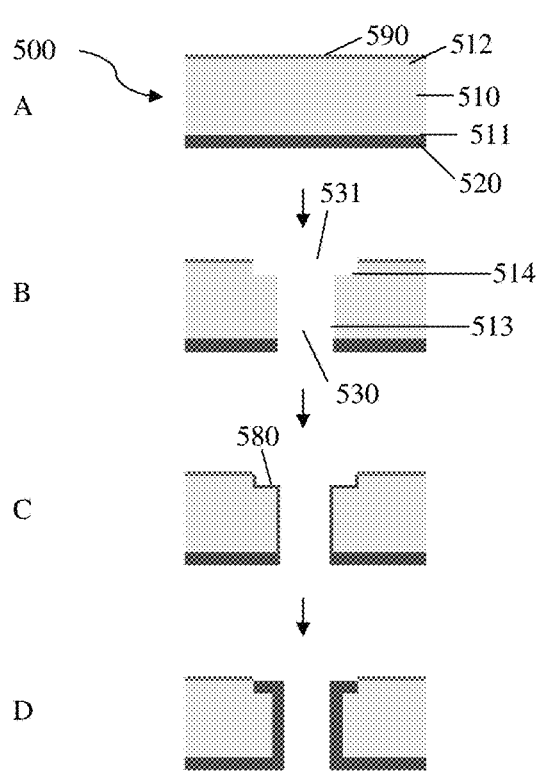
FIG. 5 illustrates a cross-sectional view of metal deposition along the sides of a channel using asymmetrical electrolytic plating, using an electroless metal deposition blocker.

FIG. 5 shows steps of another process 500 in which metal is deposited along the sides of channel 530 using asymmetrical electrolytic plating. In step A, surface 511 (e.g., bottom) of substrate 510 is coated by a layer of electrical conductor 520, with surface 512 (e.g., top) coated by electroless blocker 590. In step B, channel 530 and trench 531 are created through the substrate and electroless blocker 590, with trench 531 crossing a mouth of channel 530 proximal to surface 512. The diameter and the depth of the trench 531 are greater and lesser than those of channel 530, respectively. In step C, electroless plating is performed to deposit conductor 580 along surface 513 of channel 530 and surface 514 of trench 531. In step D, electrolytic plating is applied to further deposit conductor along surface 513 of channel 530, and surface 514 of trench 531. Optional, electroless blocker 560 is then removed.

Figure 6:
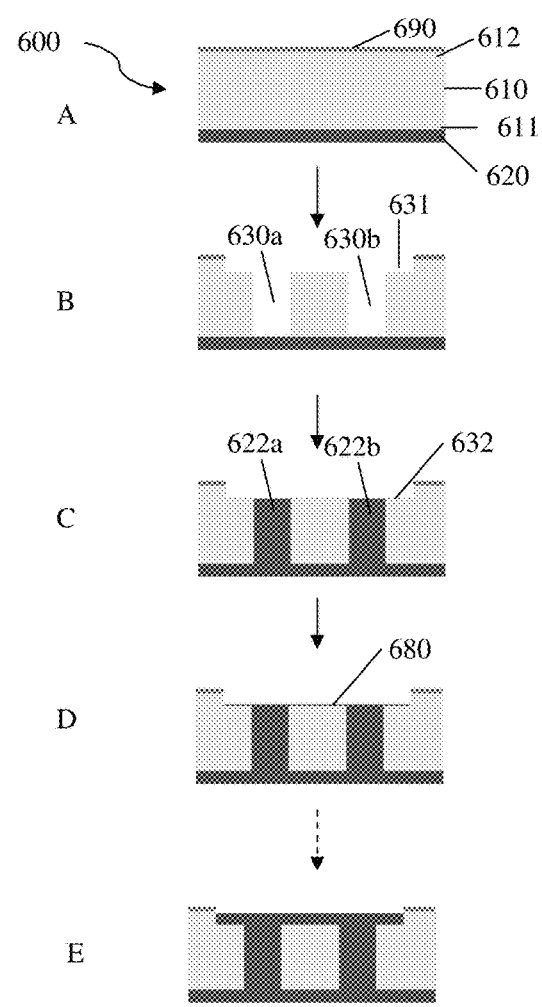
FIG. 6 illustrates a cross-sectional view of metal deposition into a channel using asymmetrical electrolytic plating, followed by the electroless plating.

FIG. 6 shows steps of another process 600 in which metal is deposited into channel 630 using asymmetrical electrolytic plating. In step A, surface 611 (e.g., bottom) of substrate 610 is coated by a layer of electrical conductor 620, and surface 612 (e.g., top) is coated by electroless blocker 690. In step B, blind channels 630a and 630b are formed through electroless blocker 690 and substrate 610 from surface 612 toward surface 611. Blind channels 630a and 630b do not penetrate conductor 620. Trench 631 is also formed across the mouths of blind channels 630a and 630b, proximal to surface 612 and electroless blocker 690. Preferably, the diameter and the depth of trench 631 are greater and lesser than those of blind channels 630a and 630b, respectively. In step C, conductor 622a and 622b is then plated or deposited inside channels 630a and 630b up to trench base 632, using at least one of electrolytic and electroless plating, preferably electrolytic plating. In step D, the surface of both substrate 610 and conductor 622a and 622b is further covered by conductor 680 via electroless plating. In some embodiments, additional conductor is deposited on top of conductor 680 by electrolytic plating to increase the layer of conductor (see step E).

The discussion herein provides example embodiments of the inventive subject matter. Although each embodiment represents a single combination of inventive elements, the inventive subject matter is considered to include all possible combinations of the disclosed elements. Thus if one embodiment comprises elements A, B, and C, and an intermediate embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of creating an electrically conductive via in a substrate having a first side and a second side, comprising the ordered steps of:
   creating a channel through the substrate; and
   using electrolytic plating to deposit a metal procedurally on the substrate, first from a conductor at a first region about the channel on the first side of the substrate, then along a wall of the channel, and then to a second region about the second side of the substrate;
   further comprising placing a plating resist onto a portion of the substrate, thereby further protecting the substrate from metal deposition, wherein the plating resist only inhibits metal deposition by electroless plating, and is a polymer.

2. The method of claim 1, wherein the conductor is coupled to the substrate prior to creating the channel.

3. The method of claim 1, wherein the conductor is coupled to the substrate after creating the channel.

4. The method of claim 1, wherein the step of creating the channel comprises removing a portion of the conductor.

5. The method of claim 1, wherein the channel does not extend entirely through the conductor.

6. The method of claim 1, further comprising placing an etching resist to protect a portion of the metal that had been plated to the first region, and then using an etching process to remove at least some of the metal not protected by the etching resist.

7. The method of claim 6, wherein the etching resist is selected from the group consisting of photoimagable and non-photoimagable polymer film, wax, metal, oligomer, and hardmask.

8. The method of claim 1, further comprising placing an etching resist to protect a portion of the metal that had been plated to the second region, and then using an etching process to remove at least some of the metal not protected by the etching resist.

9. The method of claim 1, wherein the substrate is selected from the group consisting of dielectric material ceramic, polymer and insulated metal.

10. The method of claim 1, wherein the metal is selected from the group consisting of gold, silver, nickel, copper, aluminum, lithium, iron, palladium, platinum, iridium, and corresponding alloys.

11. The method of claim 1, wherein the conductor is selected from the group consisting of gold, silver, nickel, copper, aluminum, lithium, iron, palladium, platinum, iridium, corresponding alloys and non-metals including carbon.

12. The method of claim 1, the channel is formed by photolithography technique or abrasion technique.

13. The method of claim 1, wherein the plating resist is selected from the group consisting of photoimagable and non-photoimagable polymer film, wax, oligomer, and hardmask.

* * * * *